United States Patent
Kato et al.

(10) Patent No.: US 11,181,576 B2
(45) Date of Patent: Nov. 23, 2021

(54) ELECTRONIC COMPONENT HANDLING APPARATUS AND ELECTRONIC COMPONENT TESTING APPARATUS

(71) Applicant: ADVANTEST Corporation, Tokyo (JP)

(72) Inventors: Yasuyuki Kato, Tokyo (JP); Yuya Yamada, Tokyo (JP); Shintaro Takaki, Tokyo (JP); Hiroki Hosogai, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 16/860,515

(22) Filed: Apr. 28, 2020

(65) Prior Publication Data

US 2020/0371158 A1 Nov. 26, 2020

(30) Foreign Application Priority Data

May 23, 2019 (JP) .............................. JP2019-096858

(51) Int. Cl.
*G01R 31/28* (2006.01)
*G01R 1/04* (2006.01)

(52) U.S. Cl.
CPC ....... *G01R 31/2893* (2013.01); *G01R 1/0466* (2013.01); *G01R 31/2875* (2013.01); *G01R 31/2887* (2013.01)

(58) Field of Classification Search
CPC .. G01R 1/0408; G01R 1/0433; G01R 1/0483; G01R 1/07314; G01R 1/26; G01R 31/2808; G01R 1/0466; G01R 31/2879; G01R 31/2886; G01R 31/2889; G01R 31/2896

See application file for complete search history.

(56) References Cited

U.S. PATENT DOCUMENTS

| 5,847,293 | A | 12/1998 | Jones | |
|---|---|---|---|---|
| 6,384,360 | B1* | 5/2002 | Masuo | ............... H05K 13/0409 209/573 |
| 2005/0155219 | A1 | 7/2005 | Hwang | |
| 2014/0312924 | A1* | 10/2014 | Imai | ................... G01R 31/2893 324/750.08 |
| 2019/0302178 | A1* | 10/2019 | Saito | .................. G01R 31/2865 |

FOREIGN PATENT DOCUMENTS

| JP | 2012-215588 A | 11/2012 |
|---|---|---|
| TW | I593969 B | 8/2017 |
| TW | I624889 B | 5/2018 |

OTHER PUBLICATIONS

Office Action issued in corresponding Taiwanese Patent Application No. 109111473, dated Jan. 29, 2021 (6 pages).

* cited by examiner

*Primary Examiner* — Tung X Nguyen
(74) *Attorney, Agent, or Firm* — Osha Bergman Watanabe & Burton LLP

(57) ABSTRACT

An electronic component handling apparatus includes: a moving device that presses a device under test (DUT) against a socket of a test head. The moving device includes: a pusher that contacts the DUT; and a heater that heats the DUT through the pusher. The pusher includes: an internal space; and a first flow path that communicates with the internal space. Fluid from the test head is supplied to the internal space through the first flow path.

10 Claims, 5 Drawing Sheets

ELECTRONIC COMPONENT HANDLING APPARATUS AND ELECTRONIC COMPONENT TESTING APPARATUS

CROSS-REFERENCE TO RELATED APPLICATIONS

This application claims priority from Japanese Patent Application No. 2019-096858 filed on May 23, 2019, the contents of which are incorporated herein by reference in their entirety.

BACKGROUND

Technical Field

The present invention relates to an electronic component handling apparatus and an electronic component testing apparatus used for testing an electronic component under test (DUT: Device Under Test) such as a semiconductor integrated circuit device.

Description of the Related Art

As an electronic component inspection apparatus, there has been known an apparatus which includes a mechanism for heating and cooling an IC chip and performs a temperature load test of the IC chip (for example, see Patent Document 1).

PATENT DOCUMENT

Patent Document 1: JP 2012-215588 A

The above inspection apparatus includes a heater for heating the IC chip and an evaporator for cooling the IC chip. However, since the refrigerant supply piping is provided inside the measurement robot, the structure of the internal piping is complicated, and the cost of the measurement robot may increase.

SUMMARY

One or more embodiments of the present invention provide an electronic component handling apparatus and an electronic component testing apparatus capable of reducing costs.

[1] An electronic component handling apparatus according to one or more embodiments of the present invention comprises a moving device which presses a DUT against a socket of a test head, wherein the moving device includes: a pusher which contacts the DUT; and a heating unit (heater) which heats the DUT through the pusher, the pusher includes: an internal space; and a first flow path which communicates with the internal space, and fluid is supplied from the test head to the internal space through the first flow path.

[2] In one or more embodiments, the pusher may include a first connection port which is detachably connected to the test head and receives the fluid from the test head; and the first flow path may communicate with the first connection port.

[3] In one or more embodiments, the first connection port may be connected to the test head when the DUT is pressed to the socket by the moving device.

[4] In one or more embodiments, the pusher may include: a first guide pin which can be fitted into a first guide hole which is formed in a socket guide of the test head; and a first connection pin a first connection hole which is formed in the socket guide, and at least a part of the first flow path may be provided inside the first connection pin, and the first connection port may be formed in the first connection pin.

[5] In one or more embodiments, when the DUT which contacts the pusher and the socket are opposed to the each other, the distance between the first guide pin and the first guide hole may be shorter than the distance between the first connection pin and the first connection hole so that the fitting between the first guide pin and the first guide hole starts before the fitting between the first connection pin and the first connection hole.

[6] In one or more embodiments, the pusher may have a first guide pin that can be fitted into a first guide hole which is formed in a socket guide of the test head, at least a part of the first flow path may be provided inside the first guide pin, and the first connection port may be formed in the first guide pin.

[7] An electronic component testing apparatus according to one or more embodiments of the present invention comprises: a test head including a socket and a socket guide which is provided around the socket, wherein the test head has a second connection port to which the first connection port is detachably connected, and the first connection port is connected to the second connection port when the DUT is pressed against the socket by the moving device.

[8] In one or more embodiments, the second connection port may be a connection hole or a guide hole formed in the socket guide.

[9] In one or more embodiments, the test head may include a second flow path which communicates with the second connection port.

[10] In one or more embodiments, the second flow path may be provided inside the socket guide.

[11] In one or more embodiments, the electronic component handling apparatus may include a supply device which supplies the fluid and a third flow path which connects the supply device and the second flow path.

[12] In one or more embodiments, the pusher may comprise: a third connection port which is detachably connected to the test head and through which fluid flows to the test head; and a fourth flow path which has one end which communicates with the internal space and the other end which communicates with the third connection port, the test head may include: a fourth connection port which is detachably connected to the third connection port; and a fifth flow path which has one end which communicates with the fourth connection port and the other end which is open to the atmosphere, the third connection port is connected to the fourth connection port when the DUT is pressed into the socket by the moving device, and the fluid may be discharged to the atmosphere through the fourth and fifth flow paths after passing through the internal space.

[13] In one or more embodiments, the pusher may include a second guide pin which can be fitted into a second guide hole which is formed in the socket guide; and a second connection pin which can be fitted into a second connection hole formed in the socket guide, at least a part of the fourth flow path may be provided inside the second connection pin, and the third connection port may be formed in the second connection pin.

[14] In one or more embodiments, when the DUT contacts the pusher and the pusher and the socket are opposed to each other, the distance between the second guide pin and the second guide hole may be shorter than the distance between the second connection pin and the second connection hole so that the fitting between the second guide pin and the second guide hole starts before the fitting between the second connection pin and the second connection hole.

[15] In one or more embodiments, the pusher may include a second guide pin which can be fitted into a second guide hole which is formed in a socket guide of the test head, at least a part of the fourth flow path may be provided inside the second guide pin, and the third connection port may be formed in the second guide pin.

[16] In one or more embodiments, the fourth connection port may be a connection hole or a guide hole formed in the socket guide.

[17] In one or more embodiments, the fifth flow path may be provided inside the socket guide.

[18] In one or more embodiments, the pusher may have a fourth flow path which has one end which communicates with the internal space and the other end which is opened to the atmosphere, and the fluid may be discharged to the atmosphere through the fourth flow path after passing through the internal space.

[19] In one or more embodiments, the fluid may be room temperature air.

According to one or more embodiments, since the fluid is supplied from the test head to the pusher, the structure of the moving means can be simplified. Therefore, the cost of the electronic component handling apparatus and the electronic component testing apparatus can be reduced.

DETAILED DESCRIPTION

Hereinafter, embodiments of the present invention will be described with reference to the drawings.

Figure 1:
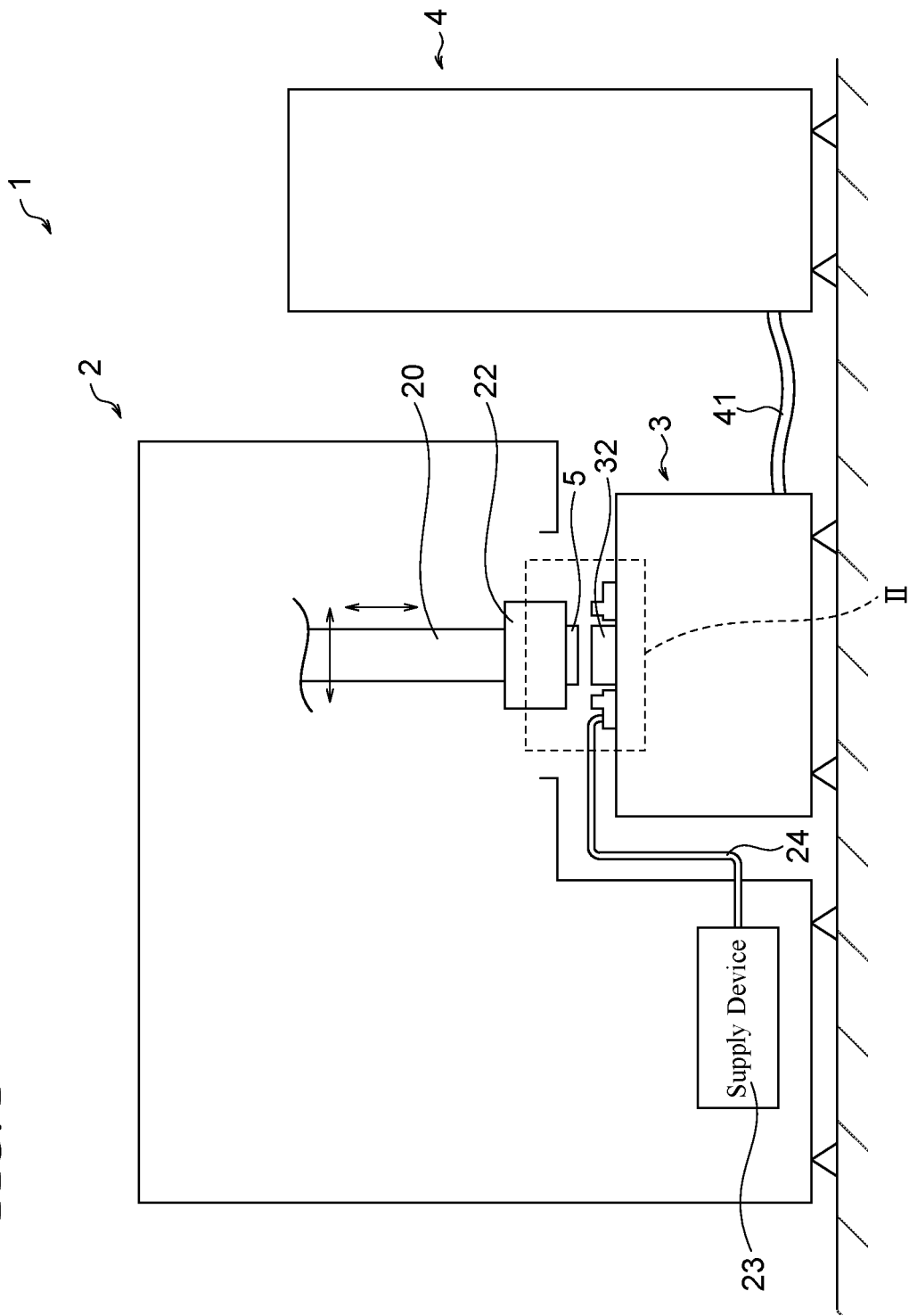
FIG. 1 is a schematic cross-sectional view showing an entire configuration of an electronic component testing apparatus according to one or more embodiments of the present invention.
Figure 2:
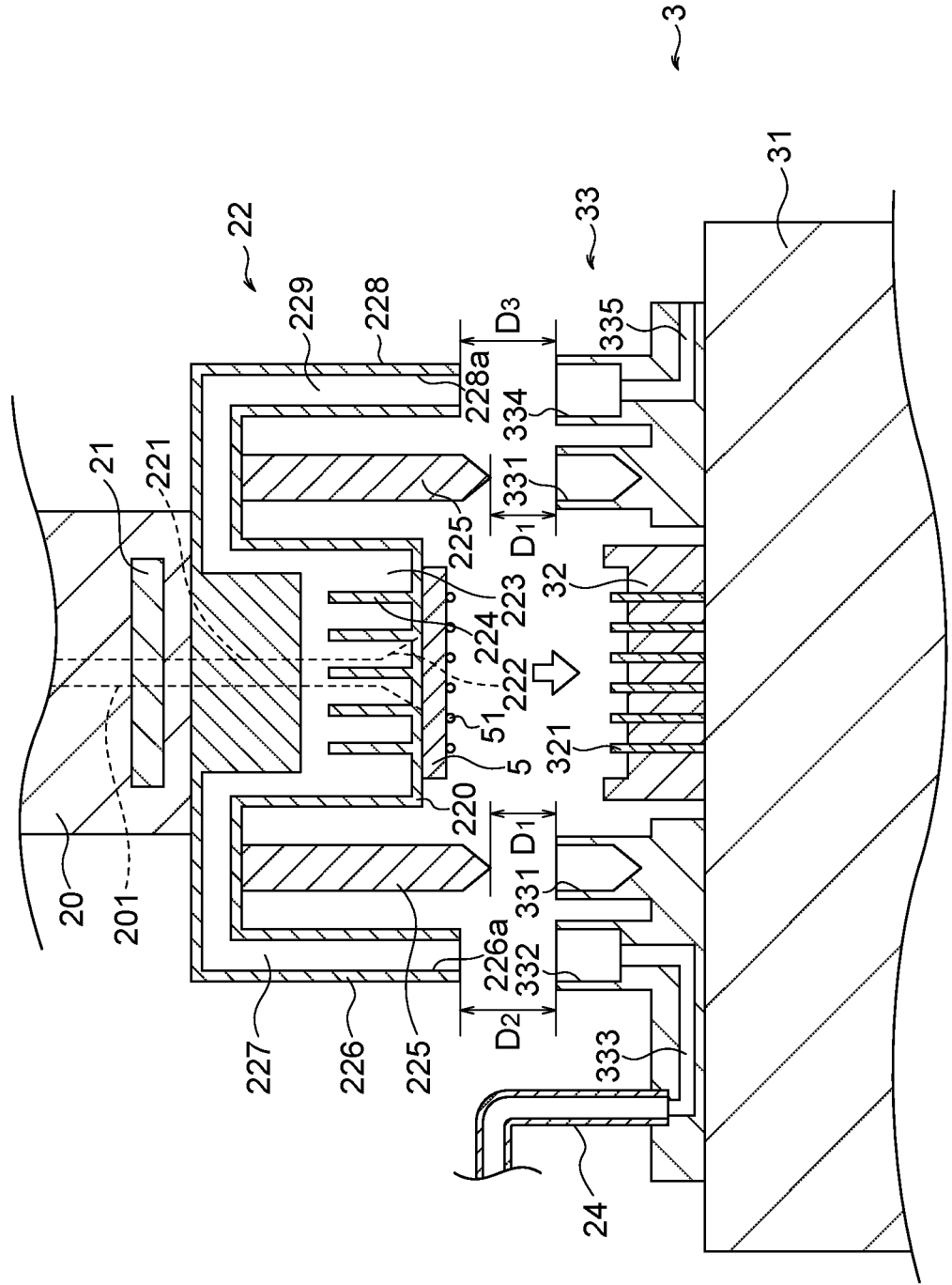
FIG. 2 is an enlarged cross-sectional view of part II of FIG. 1.
Figure 3:
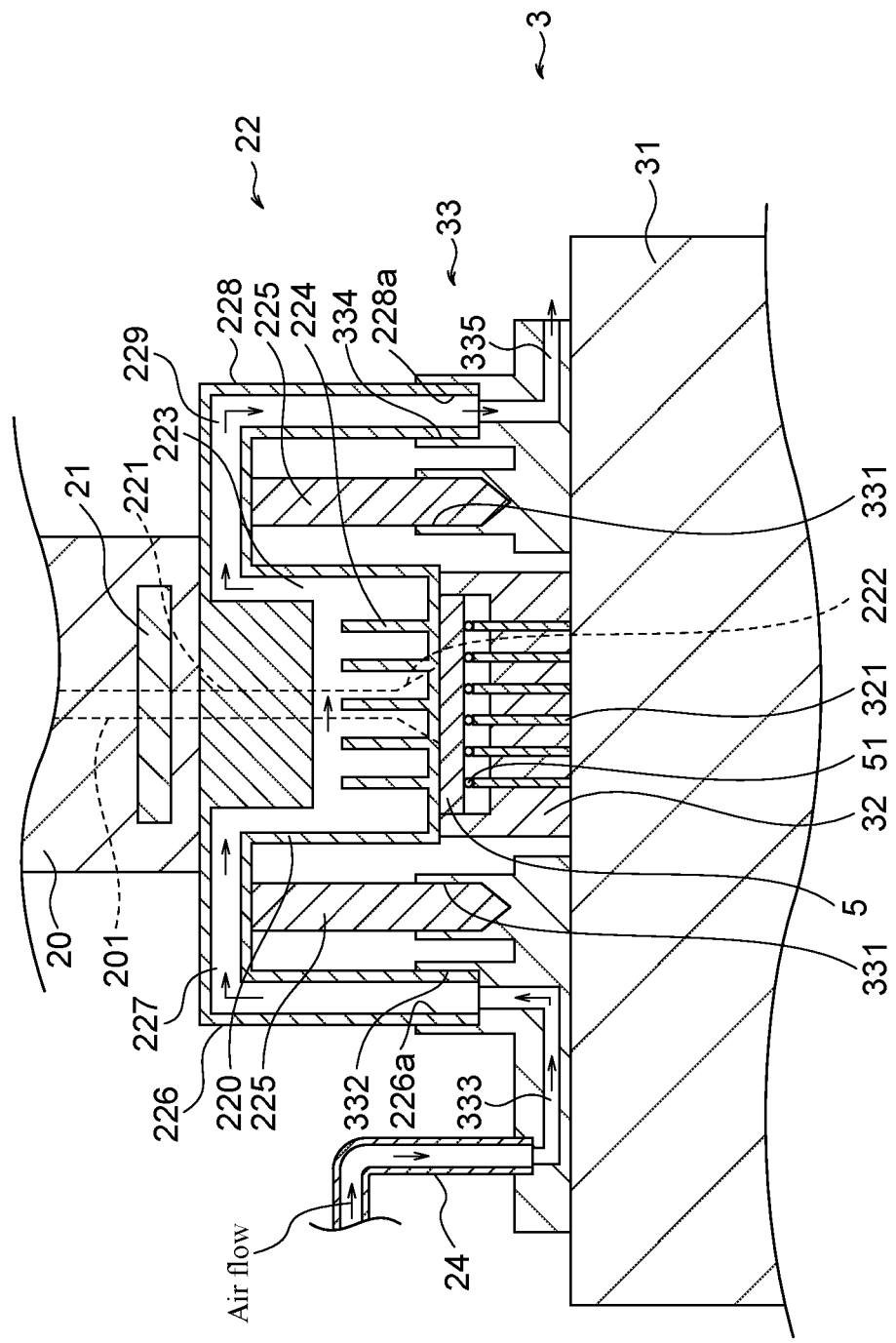
FIG. 3 is a view showing a state in which the DUT is pressed against the test head according to one or more embodiments of the present invention, and is an enlarged cross-sectional view corresponding to part II of FIG. 1.
Figure 4:
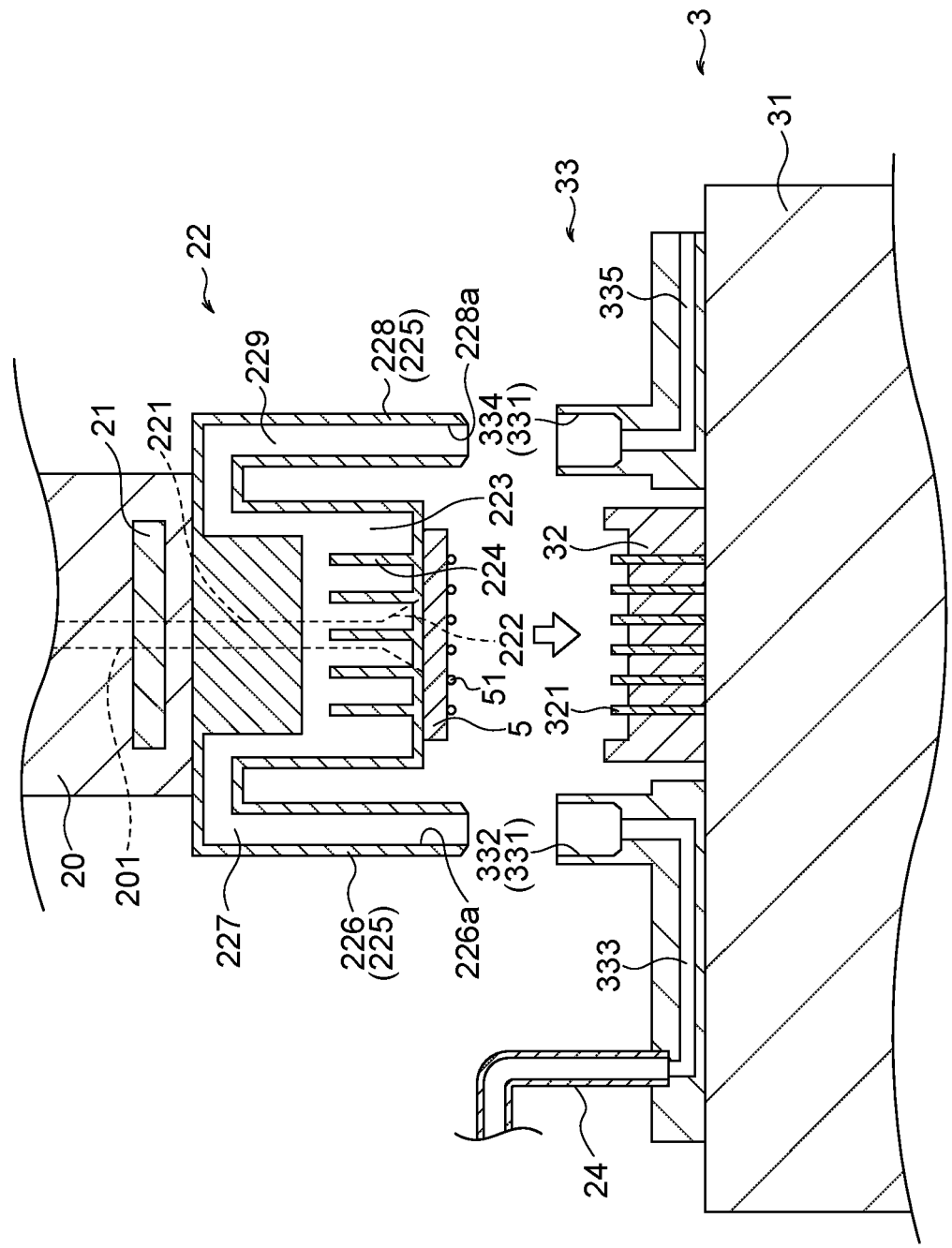
FIG. 4 is a view showing a first modification of the electronic component testing apparatus according to one or more embodiments of the present invention, and is an enlarged cross-sectional view corresponding to part II of FIG. 1.
Figure 5:
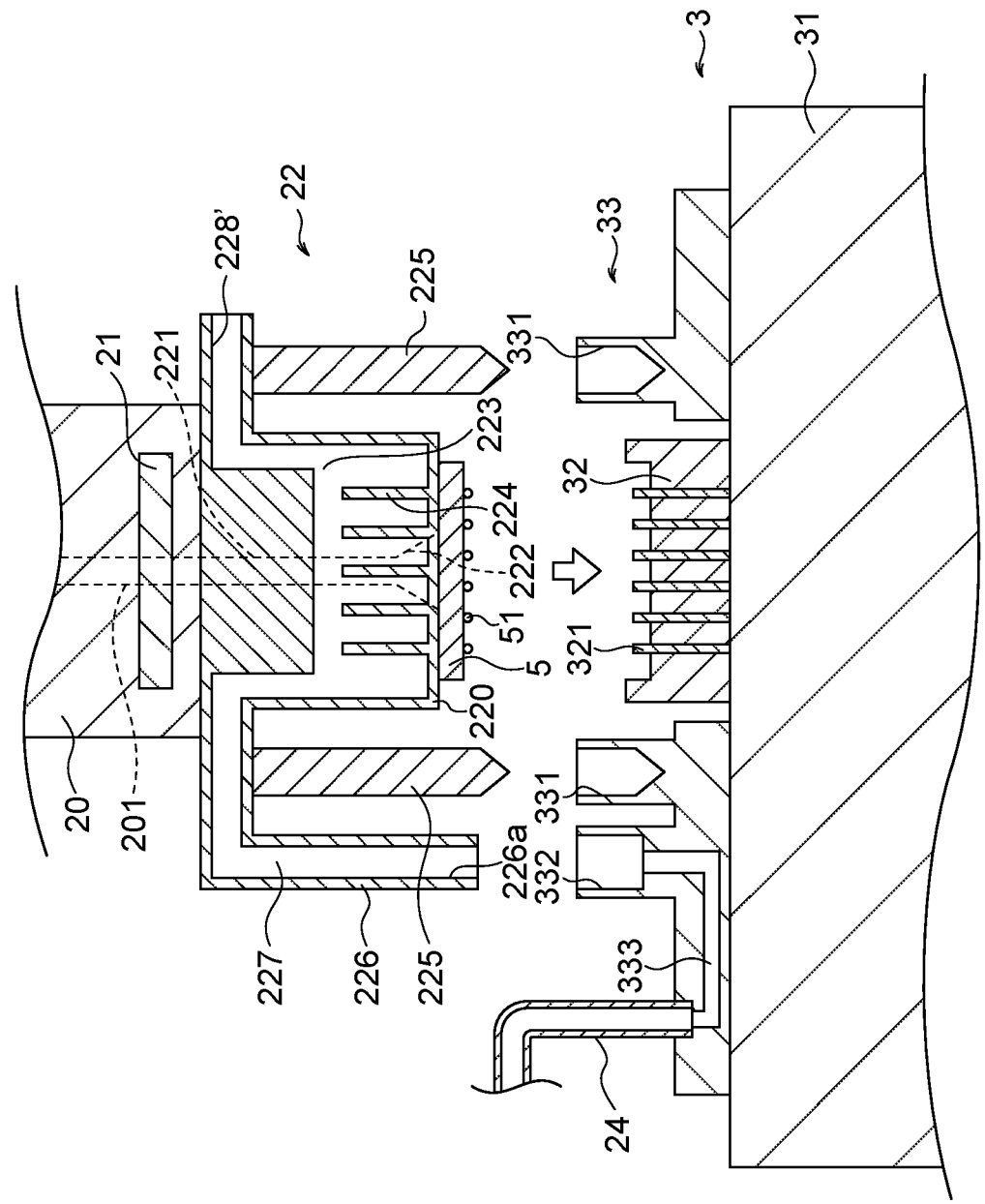
FIG. 5 is a view showing a second modification of the electronic component testing apparatus according to one or more embodiments of the present invention, and is an enlarged cross-sectional view corresponding to part II of FIG. 1.

FIG. 1 is a schematic cross-sectional view showing the overall configuration of the electronic component testing apparatus according to one or more embodiments, FIG. 2 is an enlarged cross-sectional view of the II portion of FIG. 1, FIG. 3 is a view showing a state in which the handler presses the DUT against the test head during testing of the DUT, FIG. 4 is a view showing a first modification of the electronic component testing apparatus according to one or more embodiments, and FIG. 5 is a view showing a second modification of the electronic component testing apparatus according to one or more embodiments.

The electronic component testing apparatus 1 according to one or more embodiments is an apparatus for testing electric characteristics of a Device Under Test (DUT) 5. Specific examples of the DUT 5 to be tested include a SoC (System on a chip) and a logic-device. DUT 5 to be tested by the electronic component testing device 1 is not particularly limited to the above as long as it is an electronic component, and may be, for example, a memory-device.

As shown in FIG. 1, the electronic component testing device 1 includes a handler 2 for moving a DUT 5, a test head 3 electrically connected to a DUT 5 during testing, and a tester 4 for executing a DUT 5 test. The handler 2 moves DUT 5 and presses it against sockets 32 of the test head 3 to connect DUT 5 to the test head 3. Thereafter, the tester 4 sends test signals to DUT 5 through the test head 3 to test DUT 5, and classifies DUT 5 according to the test result. The handler 2 has a temperature-regulating mechanism, and the test is performed while the handler 2 applies a thermal stress to DUT 5.

The electronic component testing apparatus 1 corresponds to an example of the "electronic component testing apparatus" in one or more embodiments of the present invention, the handler 2 corresponds to an example of the "electronic component handling apparatus" in one or more embodiments of the present invention, and the test head 3 corresponds to an example of the "test head" in one or more embodiments of the present invention.

As shown in FIGS. 1 and 2, the handler 2 includes an arm 20, a supply device 23, and a supply path 24. The arm 20 is a moving unit of DUT 5, and holds DUT 5 and moves it to the sockets 32 of the test head 3. The supply device 23 is a device for supplying air at room temperature to the pusher 22 via the test head 3. The supply path 24 is a pipe for sending air from the supply device 23 to the test head 3.

The arm 20 is supported by a rail (not shown) provided on the handler 2, and includes a suction pipe 201, a heater (heating unit) 21, and a pusher 22. The suction pipe 201 is a pipe for sucking air so that the suction pads 222 of the pusher 22 hold the air DUT 5. The heater 21 heats DUT 5 during DUT 5 test. The pusher 22 holds DUT 5 and presses DUT 5 against the sockets 32 of the test head 3, which will be described later.

The arm 20 is provided with an actuator (not shown) for horizontal movement, and can move back and forth and left and right in accordance with the rail. The arm 20 includes an actuator (not shown) for vertical movement, and can move in the vertical direction. A suction pipe 201 is formed in the arm 20 along the vertical direction. At the time of DUT 5 test, the arm 20 holding DUT 5 moves back and forth, right and left, and moves directly above the sockets 32 of the test head 3, which will be described later. Thereafter, the arm 20 is lowered, so that DUT 5 is pressed against the sockets 32 of the test head 3, which will be described later. The arm 20 corresponds to an example of the "moving device" in one or more embodiments of the present invention.

The heater 21 is provided inside the arm 20 and above the pusher 22. The heater 21 is energized during DUT 5 test and heats DUT 5 via the pusher 22. As the heater 21, an electric heating wire or the like which is heated by energization can be exemplified. The heater 21 corresponds to an example of the "heating section" in one or more embodiments of the present invention.

As shown in FIG. 2, the pusher 22 is mounted on the lower end of the arm 20, and includes a main body portion 220, a pair of guide pins 225, a first connection pin 226, and a second connection pin 228. The pusher 22 corresponds to an example of the "pusher" in one or more embodiments of the present invention.

The main body portion 220 is a substantially block-shaped metallic component, and has a function of holding DUT 5 and transferring heat generated by the heater 21 to DUT 5. As shown in FIG. 2, the main body portion 220 includes a suction pipe 221, a suction pad 222, an internal space 223, and heat radiation fins 224.

The suction pipe 221 is formed so as to penetrate the upper and lower portions of the pusher 22. The upper end of the suction pipe 221 communicates with the lower end of the suction pipe 201 formed in the arm 20. The lower end of the suction pipe 221 communicates with the suction pad 222.

The suction pad 222 is provided in communication with the suction pipe 221, and opens at the lower surface of the main body portion 220. Air is sucked from the suction pads 222, whereby the pusher 22 can hold DUT 5.

The internal space 223 is a space provided inside the main body portion 220. The interior space (or internal space) 223 is supplied with air from the above-mentioned supply device 23 through the test head 3 during DUT 5 test. The internal space 223 corresponds to an example of the "internal space" in one or more embodiments of the present invention.

As shown in FIG. 2, the radiator fins 224 are provided in the internal space 223. Although not particularly limited, in one or more embodiments, the heat radiating fin 224 is erected on the bottom surface of the internal space 223 and protrudes from the bottom surface toward the internal space 223. The radiator fins 224 have a function of adjusting the heat applied to DUT 5 through the pusher 22 by exchanging heat with the air supplied from the supply device 23 and cooling the heat applied to the pusher 22 from the heater 21.

As shown in FIGS. 2 and 3, the guide pin 225 is provided on the side surface of the main body portion 220 and extends downward. The shape of the lower end of the guide pin 225 narrows downward. The guide pins 225 fit into guide holes 331 of the socket guides 33 of the test head 3 as the pusher 22 descends during DUT 5 test. Thereby, DUT 5 is positioned with respect to the socket 32 of the test head 3, which will be described later, and the pusher 22 can accurately press DUT 5 against the socket 32.

In FIG. 2, the number of guide pins 225 is two, but the number is not particularly limited thereto. The number of the guide pins 225 may be one or three or more.

As shown in FIG. 2, the first connection pin 226 is attached to the side surface of the main body portion 220 and extends downward. A first connection port 226*a* is opened at the tip of the first connection pin 226. As shown in FIG. 3, the first connection pins 226 are detachably connected to the first connection holes 332 (described later) of the socket guides 33 of the test head 3 when DUT 5 is pressed to the socket 32 (described later).

The position of the first connection port 226*a* of the first connection pin 226 is not limited to the above. For example, the first connection port 226*a* may be formed on the side surface of the first connection pin 226.

A ventilation path 227 is formed inside the first connection pin 226. One end of the ventilation path 227 communicates with the internal space 223 described above. The other end of the ventilation path 227 communicates with the first connection port 226*a*. As shown in FIG. 3, the first connection port 226*a* is connected to the first connection hole 332 (to be described later) of the socket guide 33, so that the other end of the ventilation path 227 communicates with the ventilation path 333 (to be described later) of the socket guide 33. The ventilation path 227 receives air supplied from the supply device 23 during DUT 5 test.

The first connection port 226*a* corresponds to an example of the "first connection port" in one or more embodiments of the present invention, and the ventilation path 227 corresponds to an example of the "first flow path" in one or more embodiments of the present invention.

As shown in FIG. 2, the second connection pin 228 is attached to the side surface of the main body portion 220 and extends downward. A second connection port 228*a* is opened at the tip of the second connection pin 228. As shown in FIG. 3, the second connection pins 228 are detachably connected to the second connection holes 334 of the socket guides 33 of the test head 3 during DUT 5 test.

The position of the second connection port 228*a* of the second connection pin 228 is not limited to the above. For example, the second connection port 228*a* may be formed on the side surface of the second connection pin 228.

A ventilation path 229 is formed inside the second connection pin 228. One end of the ventilation path 229 communicates with the internal space 223 described above. The other end of the ventilation path 229 communicates with the second connection port 228*a*. As shown in FIG. 3, the second connection port 228*a* is connected to the second connection hole 334 (to be described later) of the socket guide 33, so that the other end of the ventilation path 229 communicates with the ventilation path 335 (to be described later) of the socket guide 33. The air supplied to the inner space 223 during DUT 5 test flows to the test head 3 through the ventilation path 229 after the air is exchanged with the heat radiation fins 224.

The second connection port 228*a* corresponds to an example of the "third connection port" in one or more embodiments of the present invention, and the ventilation path 229 corresponds to an example of the "fourth flow path" in one or more embodiments of the present invention.

Here, as shown in FIG. 2, the guide pin 225 of one or more embodiments is formed so that the lower end of the guide pin 225 is positioned below the lower end of the first connection pin 226.

That is, when DUT 5 held by the pusher 22 and the socket 32 (to be described later) are opposed to each other, the distance D1 between the lower end of the guide pin 225 and the guide hole 331 (to be described later) of the socket guide 33 of the test head 3 is shorter than the distance D2 between the lower end of the first connection pin 226 and the first connection hole 332 of the socket guide 33 of the test head 3 (D1<D2). Therefore, when the pusher 22 moves downward during DUT 5 test, the connection between the guide pins 225 and the guide holes 331 (to be described later) starts before the connection between the first connection ports 226*a* and the first connection holes 332 (to be described later).

As a result, the first connection ports 226*a* of the first connection pins 226 and the first connection holes 332 (to be described later) of the socket guides 33 are connected to each other after DUT 5 of the test head 3 is positioned with respect to the socket 32 (to be described later), so that the first connection ports 226*a* and the first connection holes 332 (to be described later) can be accurately connected to each other.

The guide pin 225 of one or more embodiments is formed so that the lower end of the guide pin 225 is positioned below the lower end of the second connection pin 228.

That is, when DUT 5 held by the pusher 22 and the socket 32 (to be described later) are opposed to each other, the distance D1 between the lower end of the guide pin 225 and the guide hole 331 (to be described later) of the socket guide 33 of the test head 3 is shorter than the distance D3 between the lower end of the second connection pin 228 and the second connection hole 334 of the socket guide 33 of the test head 3 (D1<D3). Therefore, when the pusher 22 moves downward during DUT 5 test, the connection between the guide pins 225 and the guide holes 331 (to be described later) starts before the connection between the second connection ports 228a and the second connection holes 334 (to be described later).

As a result, the second connection ports 228a of the second connection pins 228 and the second connection holes 334 (to be described later) of the socket guides 33 are connected to each other after DUT 5 of the test head 3 is positioned with respect to the socket 32 (to be described later), so that the second connection ports 228a and the second connection holes 334 (to be described later) can be accurately connected to each other.

The supply device 23 is provided with a pump for supplying air and a valve for adjusting the flow rate, though not particularly shown. The supply device 23 corresponds to an example of the "supply device" in one or more embodiments of the present invention.

The supply path 24 is a pipe connecting the supply device 23 and the test head 3. Specifically, one end of the supply path 24 communicates with the supply device 23, and the other end of the supply path 24 communicates with a ventilation path 333 of the socket guide 33 of the test head 3. During DUT 5 test, the air supplied from the supply device 23 passes through the supply path 24 and is sent to the inner space 223 of the pusher 22 via the test head 3. The supply path 24 corresponds to an example of the "third flow path" in one or more embodiments of the present invention.

The test head 3 includes a main body portion 31, a socket 32 connected to DUT 5, and socket guides 33. The socket 32 corresponds to an example of the "socket" in one or more embodiments of the present invention, and the socket guide 33 corresponds to an example of the "socket guide" in one or more embodiments of the present invention.

As shown in FIG. 1, the main body portion 31 is connected to the tester 4 via cables 41, and transmits test signals to DUT 5 during DUT 5 testing. Although not shown in particular, a pin electronics card electrically connected to the socket 32 is accommodated in the main body portion 31.

The socket 32 is provided on the main body portion 31. The sockets 32 have contactors 321 arranged so as to correspond to DUT 5 input/output terminals 51. The contactor 321 is not particularly limited, but a pogo pin, an anisotropic conductive rubber sheet, or the like can be exemplified. The pusher 22 causes the input/output terminal 51 of DUT 5 to contact the contactor 321 of the socket 32, thereby electrically connecting DUT 5 to the socket 32. Test signals are sent from the main body portion 31 to DUT 5 through the sockets 32.

The socket guide 33 is provided around the socket 32, and includes a guide hole 331, a first connection hole 332, an ventilation path 333, a second connection hole 334, and an ventilation path 335. The socket guides 33 are members for positioning DUT 5 with respect to the socket 32 during a DUT 5 test.

The guide hole 331 is provided at a position corresponding to the guide pin 225 on the upper surface of the socket guide 33. The guide hole 331 has a shape which can be fitted into the guide pin 225 and opens upward. In DUT 5 test, when DUT 5 is pressed against the socket 32, the guide pins 225 fit into the guide holes 331 to position DUT 5 with respect to the socket 32. The guide hole 331 corresponds to an example of the "guide hole" in one or more embodiments of the present invention.

In FIG. 2, the number of the guide holes 331 is two, but the number is not particularly limited thereto. The number of the guide holes 331 corresponds to the number of the guide pins 225 of the pusher 22.

The first connection hole 332 is provided at a position corresponding to the first connection pin 226 on the upper surface of the socket guide 33. The first connection hole 332 has a shape which can be fitted into the first connection pin 226 and opens upward. The first connection hole 332 corresponds to an example of the "second connection port" in one or more embodiments of the present invention.

The ventilation path 333 is provided inside the socket guide 33. One end of the ventilation path 333 communicates with the first connection hole 332. The other end of the ventilation path 333 communicates with the supply path 24. As shown in FIG. 3, when the first connection pin 226 fits into the first connection hole 332, the ventilation path 229 and the ventilation path 333 communicate with each other. The ventilation path 333 corresponds to an example of the "second flow path" in one or more embodiments of the present invention.

The second connection hole 334 is provided at a position corresponding to the second connection pin 228 on the upper surface of the socket guide 33. The second connection hole 334 has a shape which can be fitted into the second connection pin 228 and opens upward. The second connection hole 334 corresponds to an example of the "fourth connection port" in one or more embodiments of the present invention.

The ventilation path 335 is provided inside the socket guide 33. One end of the ventilation path 335 communicates with the second connection hole 334. The other end of the ventilation path 335 is open to the atmosphere. As shown in FIG. 3, when the second connection pin 228 is fitted into the second connection hole 334, the ventilation path 229 and the ventilation path 335 communicate with each other. The ventilation path 229 and the ventilation path 335 communicate with each other, so that the air that has passed through the internal space 223 during DUT 5 test is discharged into the atmosphere through the ventilation path 335. The ventilation path 335 corresponds to an example of the "fifth flow path" in one or more embodiments of the present invention.

Hereinafter, referring to FIGS. 2 and 3, a process of testing a DUT 5 by the electronic component testing device 1 according to one or more embodiments will be described.

First, as shown in FIG. 2, the pusher 22 of the handler 2 sucks air from the suction pipe 221 and the suction pads 222 to hold DUT 5 by suction. The pusher 22 is moved by the arm 20 and moves directly above the socket 32.

Next, the pusher 22 is lowered by the arm 20. As the pusher 22 descends, the guide pin 225 fits into the guide hole 331 of the socket guide 33. As a result, DUT 5 is positioned with respect to the sockets 32.

Next, the first connection pin 226 of the pusher 22 fits into the first connection hole 332 of the socket guide 33, and the first connection port 226a is connected to the first connection hole 332. Similarly, the second connection pin 228 fits into the second connection hole 334 of the socket guide 33, and the second connection port 228a is connected to the second connection hole 334.

At this time, in one or more embodiments, the distance D1 between the lower end of the guide pin 225 of the pusher 22 and the guide hole 331 of the socket guide 33 is shorter than the distance D2 between the first connection pin 226 of the pusher 22 and the first connection hole 332 of the socket guide 33 (D1<D2). The distance D1 between the lower end of the guide pin 225 of the pusher 22 and the guide hole 331 of the socket guide 33 is shorter than the distance D3 between the second connection pin 228 of the pusher 22 and the second connection hole 334 of the socket guide 33 (D1<D3). Therefore, after the guide pin 225 is fitted into the guide hole 331 and DUT 5 is positioned with respect to the socket 32, the first connection pin 226 is fitted into the first connection hole 332, and the second connection pin 228 is fitted into the second connection hole 334.

Next, as shown in FIG. 3, DUT 5 held by the pusher 22 is pressed by the socket 32, and the input/output terminal 51 of DUT 5 and the contactor 321 of the socket 32 contact with each other. Further, the ventilation path 227 of the pusher 22 and the ventilation path 333 of the socket guide 33 communicate with each other. Further, the ventilation path 229 of the pusher 22 and the ventilation path 335 of the socket guide 33 communicate with each other.

Next, the heater 21 is energized to start heating DUT 5, the valves of the supply device 23 are opened, and the supply of air from the supply device 23 is started. The air supplied from the supply device 23 is supplied to the internal space 223 of the pusher 22 via the supply path 24, the ventilation path 333 of the socket guide 33, and the ventilation path 227 of the first connection pin 226. It should be noted that energization of the heater 21 may be started when the arm 20 holds DUT 5.

The air supplied to the internal space 223 exchanges heat with the radiator fins 224, and cools the heat applied to the main body portion 220 of the pusher 22 by the heater 21. This adjusts the amount of heat applied to DUT 5. The air having undergone heat exchange with the heat radiation fins 224 in the internal space 223 is discharged to the atmosphere through the air passage 229 of the second connection pin 228 and the ventilation path 335 of the socket guide 33.

When a thermal stress is applied to DUT 5 by the heater 21, the test signals outputted from the tester 4 are transmitted to DUT 5 via the contactors 321 of the sockets 32, and DUT 5 test is performed.

After testing of DUT 5, the pusher 22 is moved upwardly by the arm 20 and DUT 5 is moved away from the sockets 32. This completes DUT 5 test process.

As described above, in one or more embodiments, the air for exchanging heat is supplied to the internal space 223 of the pusher 22 via the ventilation path 333 of the socket guide 33 and the ventilation path 227 of the first connecting pin 226 at the time of testing DUT 5. Therefore, it is unnecessary to provide another ventilation path for supplying air inside the arm 20, and the structure of the arm 20 can be simplified. As a result, the cost of the electronic component testing apparatus 1 can be reduced.

Incidentally, a method of directly connecting the supply path 24 to the pusher 22 without the socket guide 33 is also conceivable. However, according to this method, it takes a great deal of labor and time to replace DUT 5 variety. This is because the pusher 22 has a unique shape according to DUT 5 type, and when DUT 5 type is changed, the supply path 24 needs to be removed from the pusher 22 used so far, the pusher 22 needs to be changed to another pusher (not shown), and then the supply path 24 needs to be reconnected to a new pusher (not shown). On the other hand, in one or more embodiments, since the supply path 24 is connected to the pusher 22 via the socket guides 33, the supply path 24 does not need to be reconnected every time the pusher 22 is replaced in accordance with the replacement of DUT 5 type, and the operation efficiency can be improved.

In addition, since a ventilation path for supplying air is provided outside the main body portion 220 of the pusher 22 and does not pass through the inside of the arm 20, the air is not heated by the heater 21 before reaching the internal space 223. As a result, it is possible to improve the heat exchange efficiency with the heat radiation fins 224 in the internal space 223.

Further, the internal space 223 is provided in the vicinity of DUT 5, and the air and the heat of the radiating fins 224 can be exchanged in the vicinity of DUT 5. Therefore, it is possible to improve the responsiveness of the temperature adjustment to the temperature change of DUT 5 and improve the heat-exchange rate.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, as shown in FIG. 4, the first connection pin 226 and the guide pin 225 may be integrated with each other. The second connection pin 228 and the guide pin 225 may be integrated with each other. In this case, the first connection port 226a is formed in the guide pin 225 integrated with the first connection pin 226, and the ventilation path 227 is formed inside the guide pin 225 integrated with the first connection pin 226. The second connection port 228a is formed in the guide pin 225 integrated with the second connection pin 228, and the ventilation path 229 is formed in the guide pin 225 integrated with the second connection pin 228.

In the above case, the guide pin 225 integrated with the first connection pin 226 has a function of receiving the air supplied from the supply device 23, and has a function of determining the position of the pusher 22 with respect to the test head 3 as the guide pin. The guide pin 225 integrated with the second connection pin 228 has a function of flowing air through the internal space 223 to the test head 3, and also has a function as a guide pin like the first connection pin 226.

In addition, in this case, the first connection hole 332 and the guide hole 331 are integrated in the socket guide 33. That is, when the guiding pin 225 integrated with the first connecting pin 226 is connected to the first connecting hole 332, DUT 5 is positioned with respect to the socket 32, and the ventilation path 229 and the ventilation path 333 communicate with each other. The second connection hole 334 and the guide hole 331 are integrated with each other. That is, when the guiding pin 225 integrated with the second connecting pin 228 is connected to the second connecting hole 334, DUT 5 is positioned with respect to the socket 32, and the ventilation path 229 and the ventilation path 335 communicate with each other.

In the structure of the electronic component testing apparatus 1, as shown in FIG. 5, the pusher 22 does not have the second connection pin 228, and the test head 3 does not have the second connection hole 334. In this case, a discharge port 228' for discharging air is opened on the side surface of the pusher 22. The discharge port 228' communicates with the internal space 223 of the pusher 22. The air that has passed through the inner space 223 during DUT 5 test is discharged into the atmosphere through the discharge port 228'. In the modification shown in FIG. 5, when the handler 2 is of a type having no chamber, the structure of the temperature adjusting mechanism can be simplified.

Further, for example, although not particularly shown, the relationship between the connection pin of the pusher 22 and the connection hole of the socket guide 33 may be reversed. That is, the socket guide 33 may have a connection pin for supplying air, and the pusher 22 may have a connection hole for receiving air, and these may be detachably connected.

In addition, although not particularly shown, the connection pin of the pusher 22 and the connection hole of the socket guide 33 may not be fitted and connected, but may abut and be connected to each other. That is, the opening of the connection pin of the pusher 22 and the opening of the connection hole of the socket guide 33 may have substantially the same shape. In this case, the opening of the connection pin of the pusher 22 and the opening of the connection hole of the socket guide 33 come into contact with each other, so that the ventilation path of the connection pin and the ventilation path of the socket guide communicate with each other.

Further, the fluid supplied from the supply device 23 to the internal space 223 of the pusher 22 is not limited to the room temperature air. For example, the fluid may be a gas other than air, or may be a liquid. Further, the temperature of the fluid may be higher than the room temperature or lower than the room temperature.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Electronic component testing apparatus
2 . . . Handler
20 . . . Arm
201 . . . Suction pipe
21 . . . Heater
22 . . . Pusher
220 . . . Main body portion
221 . . . Suction pipe
222 . . . Suction pad
223 . . . Internal space
224 . . . Radiator fin
225 . . . Guide pin
226 . . . First connection pin
226a . . . First connection port
227 . . . Ventilation path
228 . . . Second connection pin
228a . . . Second connection port
228' . . . Discharge port
229 . . . Ventilation path
23 . . . Supply device
24 . . . Supply path
3 . . . Test head
31 . . . Main body portion
32 . . . Socket
321 . . . Contactor
33 . . . Socket guide
331 . . . Guide hole
332 . . . First connection hole
333 . . . Ventilation path
334 . . . Second connection hole
335 . . . Ventilation path
4 . . . Tester
41 . . . Cable
5 . . . DUT
51 . . . Input/output terminal

What is claimed is:

1. An electronic component handling apparatus comprising:
   a moving device that presses a device under test (DUT) against a socket of a test head connected to a tester testing the DUT, wherein
   the moving device comprises a pusher that contacts the DUT,
   the pusher comprises:
      an internal space; and
      a first flow path that communicates with the internal space, and
   the moving device presses the DUT against the socket while the tester sends test signals to the DUT through the test head and fluid is supplied from the test head to the internal space through the first flow path.

2. The electronic component handling apparatus according to claim 1, wherein
   the pusher comprises a first connection port that is detachably connected to the test head and receives the fluid from the test head; and
   the first flow path communicates with the first connection port.

3. An electronic component handling apparatus comprising:
   a moving device that presses a device under test (DUT) against a socket of a test head, wherein
   the moving device comprises a pusher that contacts the DUT,
   the pusher comprises:
      an internal space;
      a first flow path that communicates with the internal space;
      a guide pin that fits into a guide hole formed in a socket guide of the test head; and
      a connection pin that fits into a connection hole formed in the socket guide,
   at least a part of the first flow path is disposed inside the connection pin,
   the first connection port is formed in the connection pin, and
   fluid is supplied from the test head to the internal space through the first flow path.

4. The electronic component handling apparatus according to claim 3, wherein
   in a state where the DUT contacting the pusher faces the socket, the distance between the guide pin and the guide hole is shorter than the distance between the connection pin and the connection hole, and the guide pin fits into the guide hole before the connection pin fits into the connection hole.

5. An electronic component handling apparatus comprising:
   a moving device that presses a device under test (DUT) against a socket of a test head, wherein
   the moving device comprises a pusher that contacts the DUT,
   the pusher comprises:
      an internal space;
      a first flow path that communicates with the internal space; and
      a guide pin that fits into a guide hole formed in a socket guide of the test head, at least a part of the first flow path is disposed inside the guide pin, the first connection port is formed in the guide pin, and fluid is supplied from the test head to the internal space through the first flow path.

6. An electronic component testing apparatus comprising:

the electronic component handling apparatus according to claim 3; and a test head that comprises:
- a socket;
- a socket guide disposed around the socket; and
- a second connection port to which the first connection port is detachably connected, and the first connection port connects to the second connection port when the DUT is pressed to the socket by the moving device.

7. The electronic component testing apparatus according to claim 6, wherein the test head further comprises a second flow path that communicates with the second connection port, and the electronic component handling apparatus further comprises:
- a supply device that supplies the fluid; and
- a third flow path that connects the supply device and the second flow path.

8. The electronic component testing apparatus according to claim 6, wherein the pusher further comprises:
- a third connection port that is detachably connected to the test head, wherein the fluid flows to the test head through the third connection port; and
- a fourth flow path that has one end that communicates with the internal space and another end that communicates with the third connection port, the test head comprises:
- a fourth connection port that is detachably connected to the third connection port; and
- a fifth flow path that has one end that communicates with the fourth connection port and another end that is open to the atmosphere, the third connection port connects to the fourth connection port when the DUT is pressed into the socket by the moving device, and the fluid is discharged to the atmosphere through the fourth and fifth flow paths after passing through the internal space.

9. The electronic component testing apparatus according to claim 6, wherein the pusher further comprises:
- a fourth flow path that has one end that communicates with the internal space and another end that is open to the atmosphere, and the fluid is discharged to the atmosphere through the fourth flow path after passing through the internal space.

10. The electronic component testing apparatus according to claim 6, wherein the fluid is room temperature air.

* * * * *